United States Patent
Yasuda et al.

[11] Patent Number: 5,949,099
[45] Date of Patent: *Sep. 7, 1999

[54] SOLID-STATE IMAGE SENSING DEVICE AND ITS DRIVING METHOD

[75] Inventors: Minoru Yasuda; Yasuhito Maki, both of Kanagawa, Japan

[73] Assignee: Sony Corporation, Tokyo, Japan

[*] Notice: This patent is subject to a terminal disclaimer.

[21] Appl. No.: 08/905,269

[22] Filed: Aug. 6, 1997

Related U.S. Application Data

[63] Continuation of application No. 08/615,781, Mar. 14, 1996, Pat. No. 5,703,386.

[30] Foreign Application Priority Data

Mar. 15, 1995 [JP] Japan .................................. P07-055294

[51] Int. Cl.[6] ........................ H01L 27/148; H01L 29/768
[52] U.S. Cl. ........................... 257/230; 257/223; 257/234
[58] Field of Search ...................................... 257/222, 223, 257/229, 230, 232–234, 615, 781

[56] References Cited

U.S. PATENT DOCUMENTS

| | | | |
|---|---|---|---|
| 4,245,164 | 1/1981 | Funabashi | 257/229 |
| 4,389,661 | 6/1983 | Yamada | 257/230 |
| 4,489,423 | 12/1984 | Suzuki | 257/232 |
| 5,703,386 | 12/1997 | Yasuda et al. | 257/230 |

*Primary Examiner*—Gene M. Munson
*Attorney, Agent, or Firm*—Hill & Simpson

[57] ABSTRACT

It is an object of the present invention to provide a solid-state image sensing device with a vertical shutter structure allowing the size of the solid-state image sensing device with ease. An electric-charge exhausting unit is provided on the same side of a sensor array comprising a plurality of sensor units arranged to form a straight line as an electric-charge transferring unit wherein the electric-charge exhausting unit comprising an electric-charge exhaust drain having a shape resembling an island and an electric-charge exhausting gate with a bent shape surrounding the electric-charge exhaust drain is provided in such a way that the electric-charge exhausting unit is in contact with a first region of a read gate, and only one electric-charge exhausting unit is provided for each pair of sensor units adjacent to each other.

4 Claims, 7 Drawing Sheets

SOLID-STATE IMAGE SENSING DEVICE AND ITS DRIVING METHOD

This is a continuation of application Ser. No. 08/615,781 filed Mar. 14, 1996, which issued as U.S. Pat. No. 5,703,380.

BACKGROUND OF THE INVENTION

1. Field of the Invention

In general, the present invention relates to a solid-state image sensing device and its driving method. In particular, the present invention relates to a solid-state image sensing device having a so-called transversal-shutter structure wherein electric charge stored in a sensor is discarded away to an electric-charge exhausting unit provided in the transversal direction of the sensor and relates to a method for driving the solid-state image sensing device.

2. Description of Related Art

Figure 10:
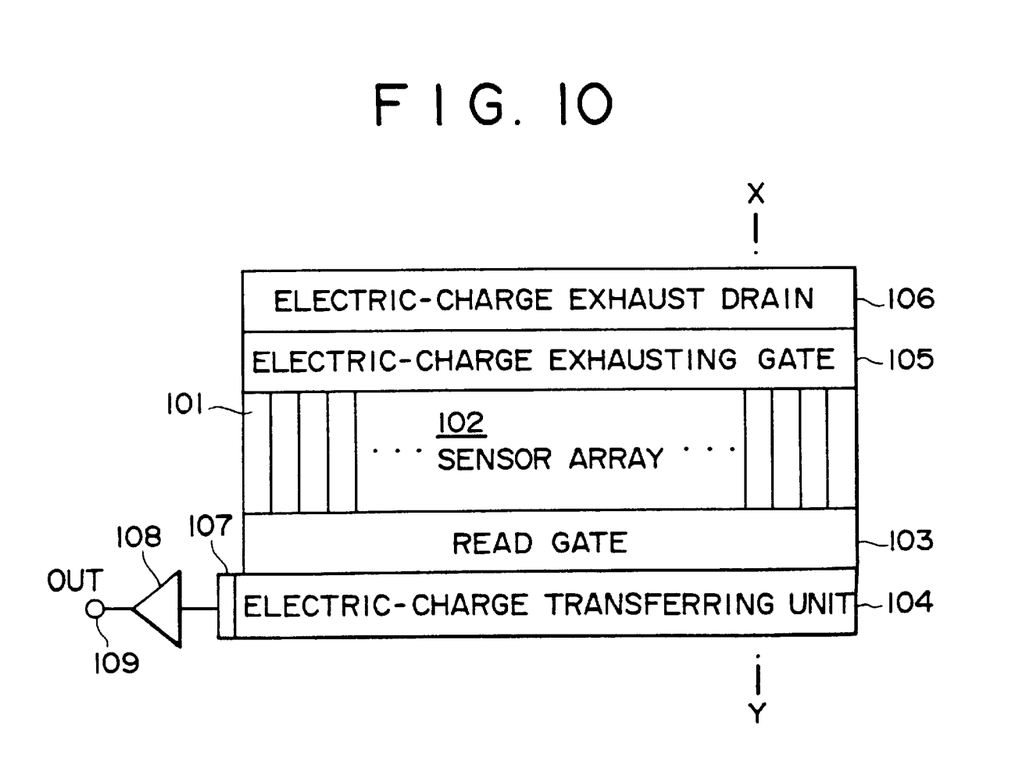
FIG. 10 is a diagram showing the configuration of the conventional CCD linear sensor having a transversal shutter structure.
Figure 11:
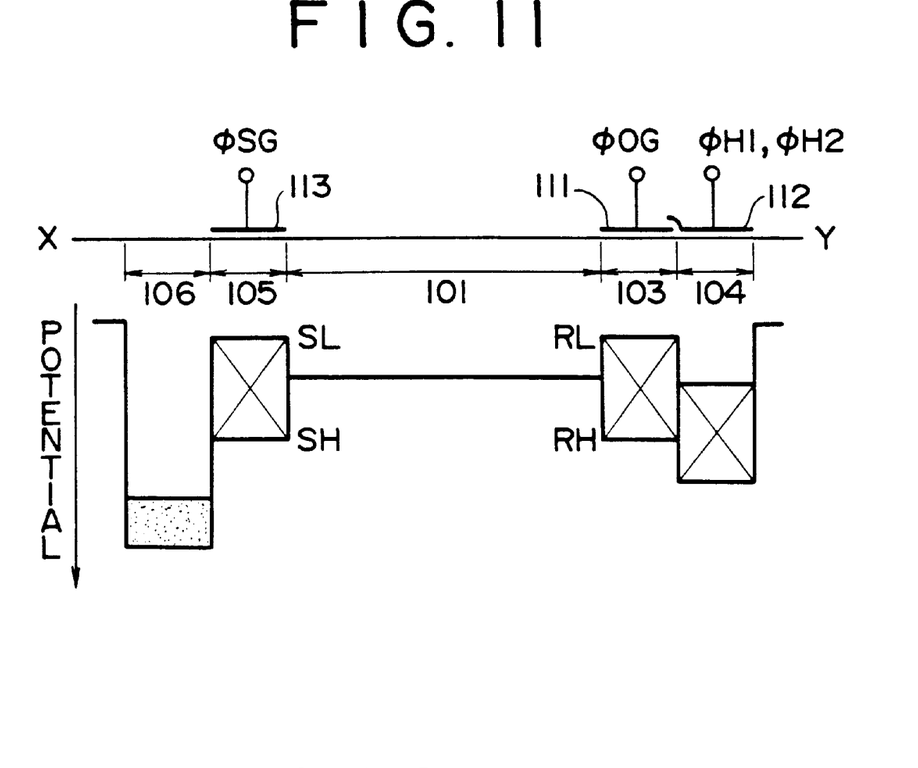
FIG. 11 is a diagram showing potentials on an X–Y cross-sectional plane shown in FIG. 10.

A typical conventional configuration of a solid-state image sensing device having a transversal-shutter structure such as a CCD linear sensor is shown in FIG. 10 whereas FIG. 11 shows potentials at a cross-sectional plane X-Y shown in FIG. 10. As shown in FIG. 10, a sensor array 102 comprises a plurality of sensor units 101 which each serve as a photoelectric conversion element. The sensor units 101 composing the sensor array 102 are arranged to form a straight line. An electric-charge transferring unit 104 is provided on one side of the sensor array 102. Read gates 103 are provided between the sensor array 102 and the electric-charge transferring unit 104 which is used for transferring electric charge read out from each of the sensor units 101 by the read gate 103. Electric-charge exhaust drains 106 are provided on the other side of the sensor array 102. Electric-charge exhausting gates 105 are provided between the sensor array 102 and the electric-charge exhaust drains 106 which are each used for discarding away electric charge read out from each of the sensor units 101 by the electric-charge exhausting gate 105. The electric charge transferred by the electric-charge transferring unit 104 is converted into a voltage by a charge-voltage converting unit 107 created at one end of the electric-charge transferring unit 104. A voltage signal resulting from the charge-to-voltage conversion is supplied to an output terminal 109 through a buffer 108, which output terminal 109 then transmits the voltage signal to a signal processing system not shown in the figure.

In a normal operation to read out electric charge in the configuration described above, a read gate pulse øROG is applied to a read gate electrode 111 of the read gate 103. The read gate pulse øROG changes a potential shown in FIG. 11 beneath the read gate electrode 111 from a shallow level RL to a deep level RH, reading out electric charge from each of the sensor units 101. Then, by applying typically two pulses øH1 and øH2 having phases different from each other to each of transfer gate electrodes 112 which are arranged in the transfer direction of the electric-charge transferring unit 104, electric charge is read out from a portion below the read gate electrode 111 and then transferred by the electric-charge transferring unit 104. In order to change the store time of electric charge in any of the sensor units 101, on the other hand, a shutter pulse øSG is applied to a shutter gate electrode 113 of the electric-charge exhausting gate 105 in a period other than an electric-charge storing period. The shutter pulse øSG changes a potential shown in FIG. 11 beneath the shutter gate electrode 113 from a shallow level SL to a deep level SH, discarding away electric charge generated in the sensor unit 101 during the period other than the electric-charge storing period to the electric-charge exhaust drain 106.

By the way, in a CCD linear sensor used as a sensor for reading bar codes or as an automatic focusing (AF) sensor of a camera, a sensor structure lengthened in the electric-charge reading direction is adopted in order to increase the optical sensitivity. In the case of a CCD linear sensor used as a sensor for reading bar codes, for example, the dimensions of an opening for a picture element are of the order of 14 $\mu$m×200 $\mu$m. If the transversal shutter structure described above is adopted in a CCD linear sensor having such a sensor structure, however, two problems are encountered. One of the problems is a read residual image due to poor reading which is in turn attributed to the long sensor structure. The other problem is a shutter residual image due to imperfectness of the shutter operation. The effect of the read residual image, one of the two problems, can be reduced by setting the read time at a large value. However, this technique imposes restrictions on conditions under which the CCD linear sensor is used.

As a countermeasure that can be taken for solving the problem as long as the structure of the sensor is concerned, a staircase-like change in potential is provided in the sensor unit 101. As shown in a potential diagram of FIG. 12, the staircase-like change takes place in the read direction of the sensor unit 101. The potential gradient having such a staircase-like shape in the sensor unit 101 makes it easy to read out electric charge therefrom, providing a technique which is considered to be capable of solving the problem due to poor reading which is in turn caused by the long sensor structure. However, even though the problem caused by poor reading can be solved by adopting this technique, the transversal shutter structure described earlier by referring to FIG. 10 can not be adopted because of the staircase-like change in potential the sensor unit. In other words, the shutter structure with a configuration wherein the electric-charge transferring unit 104 is provided on one side of the sensor array 102 while the electric-charge exhaust drain 106 is provided on the other side of the sensor array 102 can not be adopted.

On the other hand, a solid-state image sensing device having a shutter configuration wherein an electric-charge transferring unit and an electric-charge exhausting unit are provided on the same side of the sensor array is also known. An example of such a solid-state image sensing device is disclosed in Japanese Patent Laid-open No. Sho59-74667. In its shutter configuration, store electrodes are provided on the same side of the array of sensors (each serving as a light-sensitive picture element) as the electric-charge transferring unit (or a CCD register). One store electrode is provided for each picture element. The store electrode is used for storing electric charge generated by the picture element at the lower portion of the store electrode. An electric-charge exhausting unit is provided beside each store electrode for exhausting the electric charge generated at the lower portion of the store electrode. In the case of the conventional solid-state image sensing device having this shutter structure, however, a configuration wherein an electric-charge exhausting unit is provided for each picture element is adopted. Accordingly, a space for the electric-charge exhausting unit provided for each picture element in addition to the store electrode is required. As a result, such a shutter structure gives rise to a hindrance to the reduction of the size of the solid-state image sensing device.

SUMMARY OF THE INVENTION

The present invention addresses the problem described above. It is an object of the present invention to provide a solid-state image sensing device with a transversal shutter structure that allows the size of the solid-state image sensing device to be reduced with ease.

In one aspect of the present invention, the present invention provides a solid-state image sensing device with a transversal shutter configuration comprising a plurality of photoelectric conversion elements, electric-charge transferring units for transferring electric charge generated by the photoelectric conversion elements, read gates provided between the photoelectric conversion elements and the electric-charge transferring units and electric-charge exhausting units provided between the photoelectric conversion elements and the electric-charge transferring units, wherein an electric-charge exhausting elements composing the electric-charge exhausting units are each assigned to a pair of photoelectric conversion elements adjacent to each other.

In another aspect of the present invention, the present invention further provides a driving method adopted in a solid-state image sensing device comprising a plurality of photoelectric conversion elements, first read gates adjacent to the photoelectric conversion elements, second read gates adjacent to the first read gates, electric-charge transferring units adjacent to the second read gates, electric-charge exhausting gates adjacent to the first read gates and electric-charge exhaust drains adjacent to the electric-charge exhausting gates, whereby the first read gates are turned off but the electric-charge exhausting gates are turned on during an electric-charge storing period.

In the solid-state image sensing device with the configuration described above, the photoelectric conversion elements each convert an incident light applied thereto into signal electric charge, the amount of which represents the quantity of the incident light. The read gate reads out the electric charge produced by the photoelectric conversion element. The electric-charge transferring unit transfers the electric charge read out from the photoelectric conversion element to an output side. The electric-charge exhausting elements each carry out a shutter operation by discarding away electric charge read out from a pair of photoelectric conversion elements adjacent to each other.

With the driving method described above, the first read gate is turned off during an electric-charge storing period, allowing signal electric charge to be stored in the photoelectric conversion element. In addition, at that time, electric charge is generated in the first read gate, turning into noise which will be mixed with the signal electric charge. However, the electric charge generated in the first read gate during the electric-charge storing period is discarded away to the electric-charge exhaust drain through the electric-charge exhausting gate due to the fact that the electric-charge exhausting gate is turned on during the electric-charge storing period. As a result, when electric charge generated in the photoelectric conversion units is supplied to the electric-charge transferring unit through the first and second read gates, electric charge that would otherwise turn into a noise component of signal electric charge is never mixed with the signal electric charge.

DETAILED DESCRIPTION OF THE PREFERRED EMBODIMENTS

The present invention will become apparent from the following detailed description of preferred embodiments with reference to accompanying diagrams.

Figure 1:
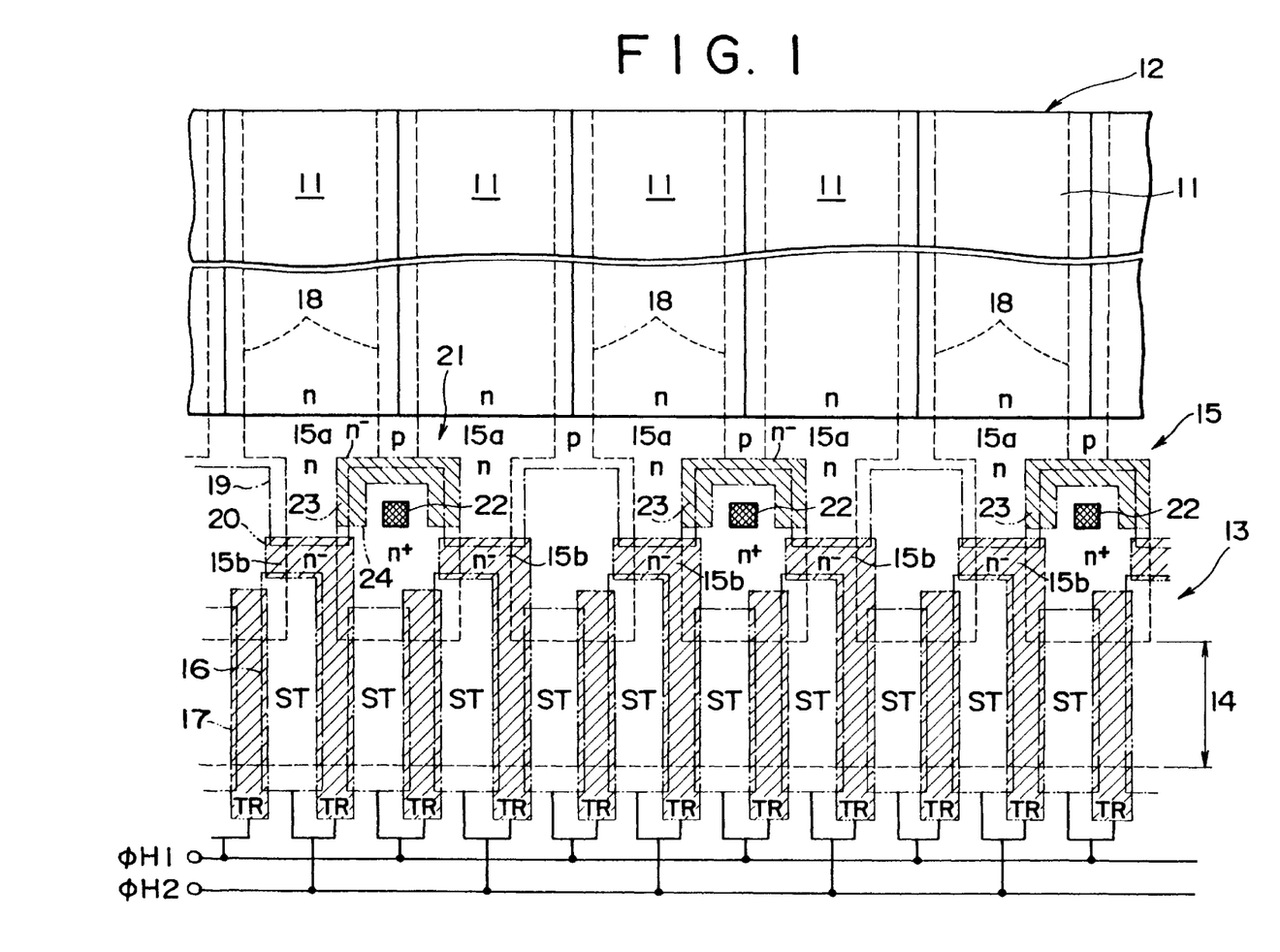
FIG. 1 is a plane diagram showing the structure of an embodiment provided by the present invention.

FIG. 1 is a plane diagram showing the configuration of an embodiment provided by the present invention. The embodiment is an example of application of the present invention to a CCD linear sensor which is typically used as a sensor for reading bar codes. As shown in the figure, the configuration includes a sensor array 12 comprising a plurality of sensor units 11 arranged to form a straight line. The sensor units 11 are each a photoelectric conversion element such as a photo diode for converting an incident light hitting a light receiving surface of the photoelectric conversion element into signal electric charge, the amount of which represents the quantity of the incident light, and storing the signal electric charge therein. The shape of each of the sensor units 11 is lengthened in the electric-charge reading direction, or the vertical direction in the figure, in order to increase the optical sensitivity. On one side of the sensor array 12, electric-charge transferring units 13 are provided along the sensor array 12.

The electric-charge transferring units 13 each include a CCD channel 14 made of an n-type impurity material. The CCD channels 14 comprise store regions ST and transfer regions TR which are arranged alternately in the electric-charge transferring direction. The electric-charge transferring unit 13 transfers signal electric charge which was generated in the sensor unit 11 of the sensor array 12 and then read out by a read gate 15. Gate electrodes having a two-layer structure are provided above the store and transfer regions ST and TR. To be more specific, a store gate electrode 16 made of polysilicon of the first layer denoted by a single-point dotted line is provided above the storing region ST. On the other hand, a transfer gate electrode 17 made of polysilicon of the second layer denoted by a double-point dotted line is provided above the transfer region TR. A store gate electrode 16 and a transfer gate electrode 17 which are adjacent to each other form a pair of electrodes (16, 17). Signal electric charge is transferred by applying clock pulses øH1 and øH2 having phases different from each other to each pair of such electrodes (16, 17).

The read gate 15 comprises a first region 15a made of an n-type impurity material created at a location adjacent to the sensor array 12 and a second region 15b made of an n⁻ type impurity material created at a location adjacent to the electric-charge transferring unit 13. A first region 15a of a picture element is linked to another first region 15a of an adjacent picture element to form a shape resembling the U character on the figure plane (in actuality, resembling the U character turned upside down on the plane of FIG. 1). The shape resembling the U character is stretched over a pair of adjacent sensor units (11, 11). It should be noted that the linked first regions 15a, which form a contiguous area stretched from one picture element to an adjacent picture element, are isolated from each other on the boundary of the two picture elements by the creation of an extension of a channel stop portion 18 from a p-type impurity material. The channel stop portion 18 is used for isolating the two sensor units (11, 11) associated with the two picture elements.

A read gate electrode 19 made of the polysilicon of the first layer indicated by a single-point dotted line is provided above the first region 15a to form a first read gate. On the other hand, a transfer gate electrode 20 made of the polysilicon of the second layer indicated by a double-point dotted line is provided above the second region 15b to form a second read gate. The first and second read gates constitute the read gate 15. In the case of this embodiment, the transfer gate electrodes 20 are each created by extending the transfer gate electrode 17 above the transfer region TR of the electric-charge transferring unit 13. As a result, the transfer gate electrode 20 above the second region 15b can also be used as the transfer gate electrode 17 above the transfer region TR of the electric-charge transferring unit 13, allowing the structure to be simplified.

As such, the read gate 15 is created on every boundary of two adjacent picture elements. On the inner side of every other read gate 15, an electric-charge exhausting unit 21 is created in such a way that the electric-charge exhausting unit 21 is in contact with the first region 15a. In this way, one electric-charge exhausting unit 21 is provided for each pair of sensor units adjacent to each other (11, 11). The electric-charge exhausting unit 21 has a configuration comprising an electric-charge exhaust drain 22 and an electric-charge exhausting gate 23. The electric-charge exhaust drain 22 is made of an n⁺ type impurity material into a shape resembling an island and provided on the inner side of the read gate 15 which has the shape like the U character turned upside down. On the other hand, the electric-charge exhausting gate 23 is made of an n⁻ type impurity material and is created to form a bent shape (a shape resembling the U character turned upside down) enclosing the electric-charge exhaust drain 22 on the upper, right and left sides thereof as is seen in the figure. A shutter gate electrode 24 made of the polysilicon of the second layer is provided above the electric-charge exhausting gate 23 as is indicated by a double-point dotted line.

Figure 2:
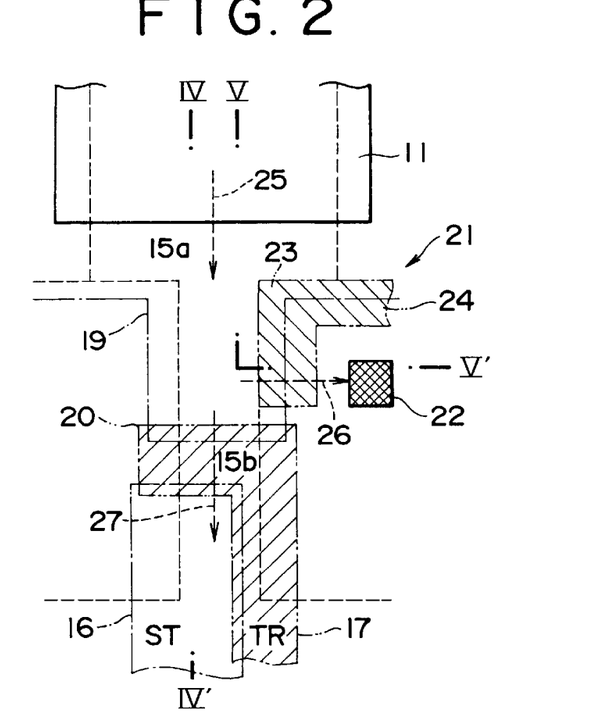
FIG. 2 is an enlarged diagram of essential components of the structure shown in FIG. 1.
Figure 4:
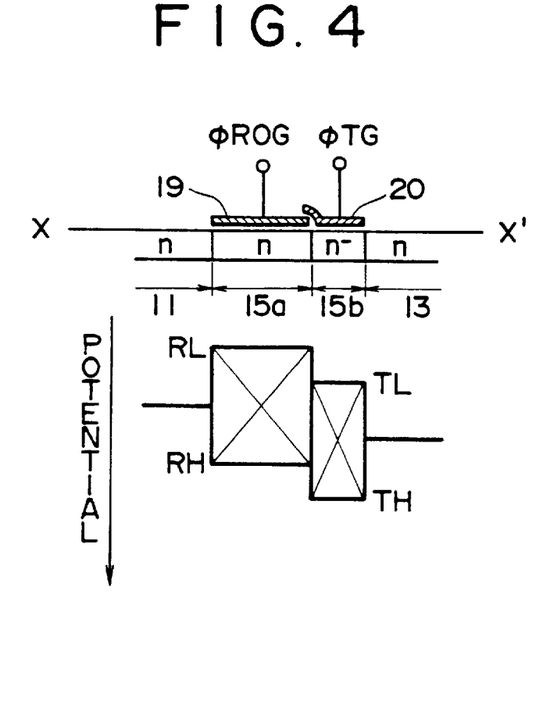
FIG. 4 is a diagram showing potentials on an X–X' cross-sectional plane shown in FIG. 2.
Figure 5:
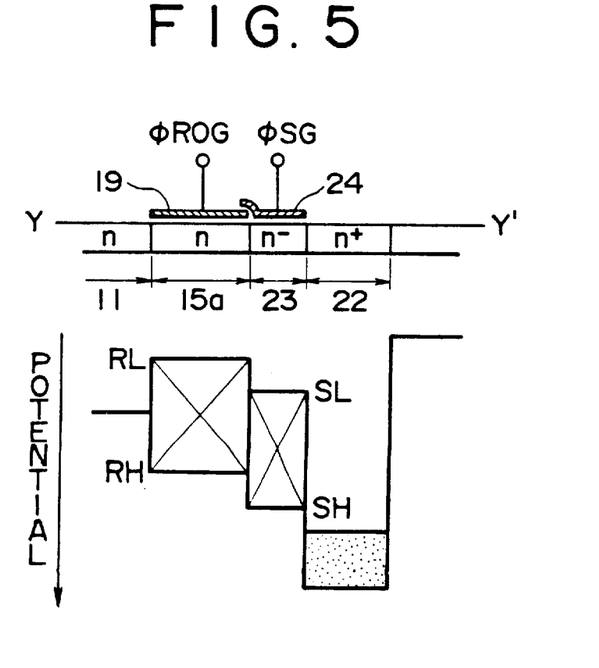
FIG. 5 is a diagram showing potentials on an Y–Y' cross-sectional plane shown in FIG. 2.

FIG. 2 is an enlarged diagram of essential parts of a CCD linear sensor having the configuration described above. Let a read gate pulse øROG, a shutter gate pulse øSG and a transfer gate pulse øTG shown in FIG. 3 be applied to the read gate electrode 19, the shutter gate electrode 24 and the transfer gate electrode 20 shown in FIG. 2 respectively. Operations resulting from the application of the pulses to the electrodes 19, 24 and 20 as such are explained as follows. It should be noted that FIGS. 4 and 5 are diagrams showing potentials at cross-sectional planes along the direction (or the read direction) indicated by the line IV—IV in FIG. 2 and the direction (or the shutter direction) indicated by the line V—V, respectively, in FIG. 2.

Figure 3:
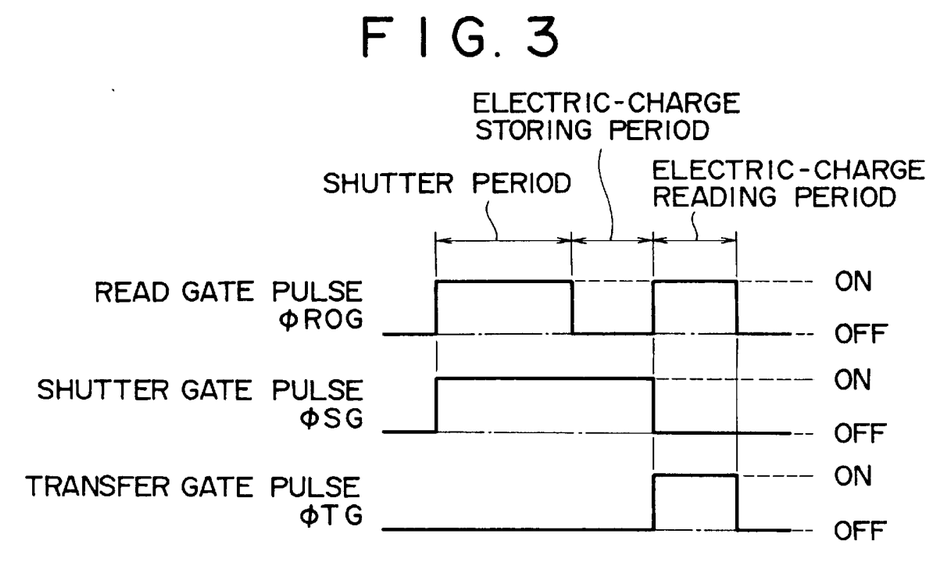
FIG. 3 is a timing chart used for explaining operations taking place during shutter, electric-charge storing and electric-charge reading periods.

First of all, during the shutter period shown in FIG. 3, the read gate pulse øROG and the shutter gate pulse øSG are put at an ON level (or the high level) while the transfer gate pulse øTG is put at an OFF level (or the low level). With the pulses put at those levels, in the potential diagrams of FIGS. 4 and 5, the potential of the first region 15a of the read gate 15 changes from a shallow state RL to a deep state RH while the potential of the second region 15b does not change, remaining at a shallow level TL. At that time, the potential of the electric-charge exhausting gate 23 of the electric-charge exhausting unit 21 changes from a shallow state SL to a deep state SH. As a result, electric charges generated in the sensor unit 11 and the read gate 15 are discarded away to the electric-charge exhaust drain 22 through the electric-charge exhausting gate 23 along arrows 25 and 26 shown in FIG. 2.

Then, during the electric-charge storing period shown in FIG. 3, the read gate pulse øROG and the transfer gate pulse øTG are put at the OFF level while the shutter gate pulse øSG is put at the ON level. With the pulses set at those levels, in the potential diagrams of FIGS. 4 and 5, the potential of the first region 15a of the read gate 15 changes from the deep state RH to the shallow state RL while the potential of the second region 15b does not change, remaining at a shallow level TL. At that time, the potential of the electric-charge exhausting gate 23 of the electric-charge exhausting unit 21 is sustained at the deep state SH. As a result, electric charge generated in the sensor unit 11 is stored in the sensor unit 11.

As described above, during the electric-charge storing period, the read gate pulse øROG is put at the OFF level while the shutter gate pulse øSG is put at the ON level. Accordingly, by applying an electric field to the electric-field exhaust drain 22 in a direction to attract electric charge generated in the first region 15a during the electric-charge storing period, which electric charge turns into noise to be mixed with signal electric charge, this electric charge is always discarded away to the electric-field exhaust drain 22. As a result, the amount of a noise component produced by a dark current and other causes developed in the first region 15a can be reduced. It should be noted that, in the case of this embodiment, the transfer gate electrode 20 is created to form a single body with the transfer gate electrode 17 of the electric-charge transferring unit 13. It is therefore impossible to independently control a voltage applied to the transfer gate electrode 20. If the transfer gate electrode 20 is created separately from the transfer gate electrode 17, however, the voltage can be controlled independently. Thus, during the electric-charge storing period, a low-level voltage can be applied to the transfer gate electrode 20 to effectively prevent electric charge generated in the first region 15a from being mixed with that in the electric-charge transferring unit 13. As a result, the amount of a noise component produced by a dark current and other causes can be reduced with a high degree of reliability.

Next, during an electric-charge reading period, the read gate pulse øROG and the transfer gate pulse øTG are put at the ON level while the shutter gate pulse øSG is put at the OFF level. With the pulses put at those levels, in the potential diagrams of FIGS. 4 and 5, the potential of the first region 15a of the read gate 15 changes from the shallow state RL to the deep state RH. Likewise, the potential of the second region 15b changes from the shallow state TL to the deep state TH. At that time, however, the potential of the electric-charge exhausting gate 23 of the electric-charge exhausting unit 21 changes from the deep state SH to the shallow state SL. As a result, electric charge stored in the sensor unit 11 is transferred to the store region ST of the electric-charge transferring unit 13 shown in FIG. 1 through the read gate 15 and the transfer gate electrode 20 along the arrow 25 and an arrow 27 shown in FIG. 2.

By repeating the cycles of the aforementioned shutter, electric-charge storing and electric-charge reading periods in a sequence described above, it is possible to carry out the operations to read and discard away electric charge. In the case of this embodiment, the transfer gate pulse øTG is synchronized with the read gate pulse øROG in an operation to read electric charge as described above. It should be noted, however, that it is not necessarily necessary to synchronize the transfer gate pulse øTG with the read gate pulse øROG. Signal electric charge can be read even if the transfer gate pulse øTG is not synchronized with the read gate pulse øROG as long as the transfer gate pulse øTG is kept in a turned-on state till the read gate pulse øROG is turned off. In addition, the length of the store time can be changed by adjusting the lengths of the electric-charge storing and shutter periods described above.

Figure 12:
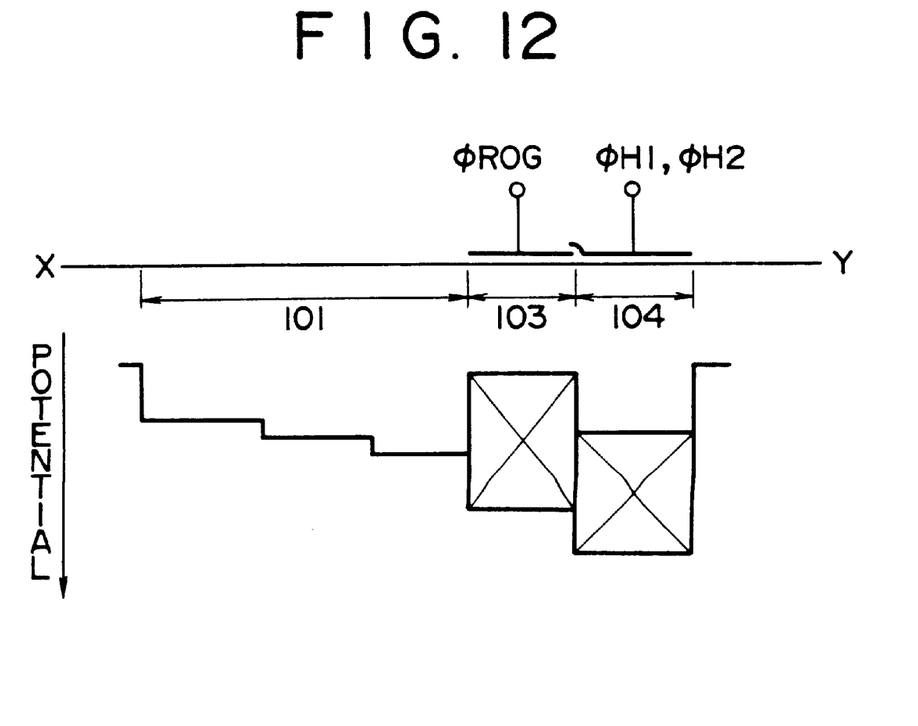
FIG. 12 is a diagram showing potentials around a sensor unit having a staircase-like potential gradient therein.

As described so far, the CCD linear sensor has a sensor structure-which is lengthened in the electric-charge reading direction by an electric-charge exhausting unit 21 provided on same side of the sensor array 12 as the electric-charge transferring unit 13. This sensor structure can also be applied as well to a scheme in which a potential gradient having a staircase-like shape is set in the electric-charge reading direction inside the sensor unit 11 as shown in FIG. 12. Accordingly, the poor-reading problem caused by the long sensor structure can be resolved and, at the same time, the shutter operation can also be implemented as well. As a result, poor-reading and shutter residual images can be eliminated. On the top of that, only one electric-charge exhausting unit 21 is provided for each pair of sensor units adjacent to each other (11, 11). Thus, the sensor pitch can be made smaller than that of the conventional technology disclosed in Japanese Patent Laid-open No. Sho59-74667 as described earlier wherein one electric-charge exhausting unit is provided for each sensor unit. As a result, space can be made smaller, giving rise to a structure which allows the size of the solid-state image sensing device to be reduced with ease.

In addition, only one read gate 15 having a form like the U character turned upside down on a drawing plane is provided for each pair of sensor units adjacent to each other (11, 11), being stretched over the pair. On the inner side of the read gate 15, the electric-charge exhausting unit 21 is provided. The electric-charge exhausting unit 21 comprises the electric-charge exhaust drain 22 and the electric-charge exhausting gate 23 having a bent shape enclosing the electric-charge exhaust drain 22. In this structure, an electric field can be applied from the sensor unit 11 to the electric-charge exhaust drain 22 through the electric-charge exhausting gate 23 with ease, allowing the efficiency of the operation to exhaust electric charge to be increased. On the top of that, the read gate 15 comprises the first region 15a created at a location adjacent to the sensor array 12 and the second region 15b created at a location adjacent to the electric-charge transferring unit 13. On the other hand, the electric-charge exhausting unit 21 is provided at a location in contact with the first region 15a. In such a configuration, the gate between the sensor unit 11 and the electric-charge transferring unit 13 can be implemented in only two stages, resulting in a structure simpler than the aforementioned conventional technology which requires a three-stage configuration. As a result, the driving operation can be simplified and the space can be made smaller.

Figure 6:
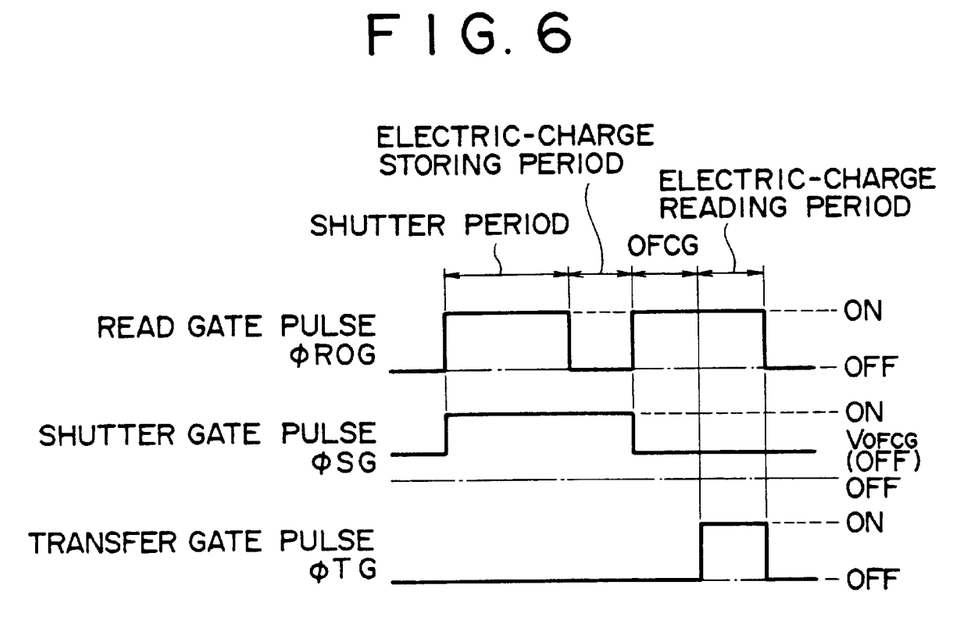
FIG. 6 is a timing chart-used for explaining operations of an OFCG function.
Figure 7:
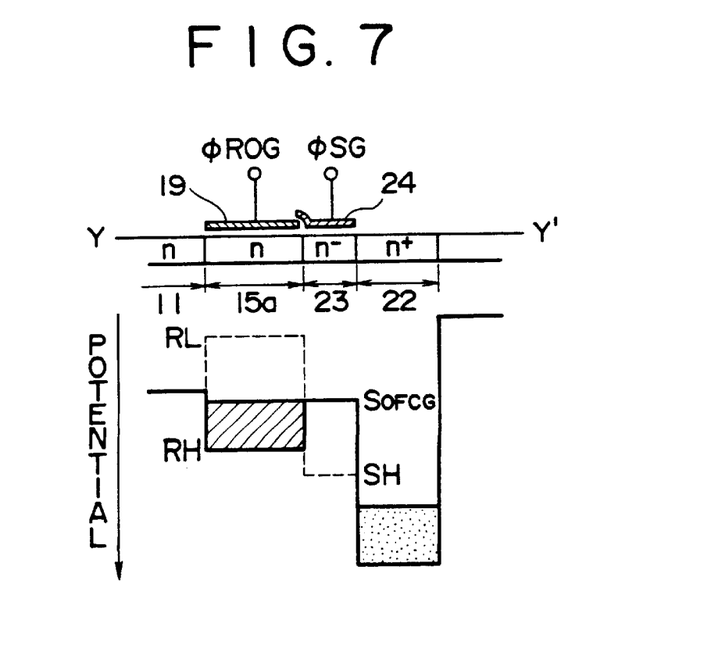
FIG. 7 is a diagram showing potentials on an Y–Y' cross-sectional plane shown in FIG. 2 during an OFCG period.

By the way, in this embodiment, by applying the read gate pulse øROG, the shutter gate pulse øSG and the transfer gate pulse øTG with driving timing shown in FIG. 6 to the read gate electrode 19, the shutter gate electrode 24 and the transfer gate electrode 20 respectively, the shutter gate electrode 24 can also be used to function as an overflow control gate (OFCG) electrode. In this case, the voltage of the overflow control gate electrode (the shutter gate electrode 24) is determined by the voltage $V_{OFCG}$ on the low-level side of the shutter gate pulse øSG. The potential on the Y–Y' cross-sectional plane of FIG. 2 at that time is shown in FIG. 7.

In the timing chart shown in FIG. 6, operations during the shutter and electric-charge storing periods are the same as those of the previous embodiment. Next, during an OFCG period following the electric-charge storing period, the read gate pulse øROG is again put at the ON level and the shutter gate pulse øSG is put at the voltage $V_{OFCG}$. During this OFCG period, the transfer gate pulse øTG remains at the OFF level as it is. With the pulses put at those levels, in the potential diagram of FIG. 7, the potential of the first region 15a of the read gate 15 changes from the shallow state RL to the deep state RH while the potential of the electric-charge exhausting gate 23 of the electric-charge exhausting unit 21 changes from the deep state SH to a state $S_{OFCG}$ (an overflow control state) which is determined by the voltage $V_{OFCG}$.

Accordingly, in the first region 15a, electric charge surmounting the potential $S_{OFCG}$ of the electric-charge exhausting gate 23 of the electric-charge exhausting unit 21 is discarded away to the electric-charge exhaust drain 22. As a result, electric charge of a fixed amount is stored in the first region 15a, which fixed amount is determined by the potential $S_{OFCG}$ of the electric-charge exhausting gate 23, that is, the voltage $V_{OFCG}$ of the shutter gate pulse øSG. As described above, in the case of this embodiment, the OFCG function is implemented by using the voltage of the shutter gate pulse øSG as the voltage $V_{OFCG}$. It should be noted that, however, by controlling the concentration of impurities in the electric-charge exhausting gate 23, the shutter gate pulse øSG can be put at an OFF level indicated by a single-point dotted line in FIG. 6, also allowing the OFCG function to be similarly implemented as well.

Next, during the electric-charge reading period shown in FIG. 6, the read gate pulse øROG and the transfer gate pulse øTG are put at the ON level while the shutter gate pulse øSG is sustained at the voltage $V_{OFCG}$ as it is. With the pulses set at those levels, the potential of the first region 15a of the read gate 15 and the potential of the electric-charge exhausting gate 23 of the electric-charge exhausting unit 21 are sustained at the deep state RH and the overflow control state $S_{OFCG}$ respectively as they are. On the other hand, in the potential diagram of FIG. 4, the potential of the second region 15b changes from the shallow state TL to the deep state TH as is the case with the embodiment described previously. As a result, electric charge of the fixed amount stored in the first region 15a during the OFCG period is transferred to the store region ST of the electric-charge transferring unit 13 shown in FIG. 1 through the transfer gate electrode 20.

As described above, during the electric-charge reading period, the read gate pulse øROG and the transfer gate pulse øTG are put at the ON level while the shutter gate pulse øSG is sustained at the voltage $V_{OFCG}$ as it is. With the pulses set at those levels, electric charge stored in the first region 15a is transferred to the electric-charge transferring unit 13. It should be noted, however, that by putting the read gate pulse øROG at the OFF level with timing synchronized to the transfer gate pulse øTG, it is also possible to transfer the electric charge stored in the first region 15a to the electric-charge transferring unit 13. By adding the OFCG function as described above, it is possible to always transfer only electric charge of a fixed amount to the electric-charge transferring unit 13 and, thus, prevent an overflow from occurring in the electric-charge transferring unit 13.

Figure 8:
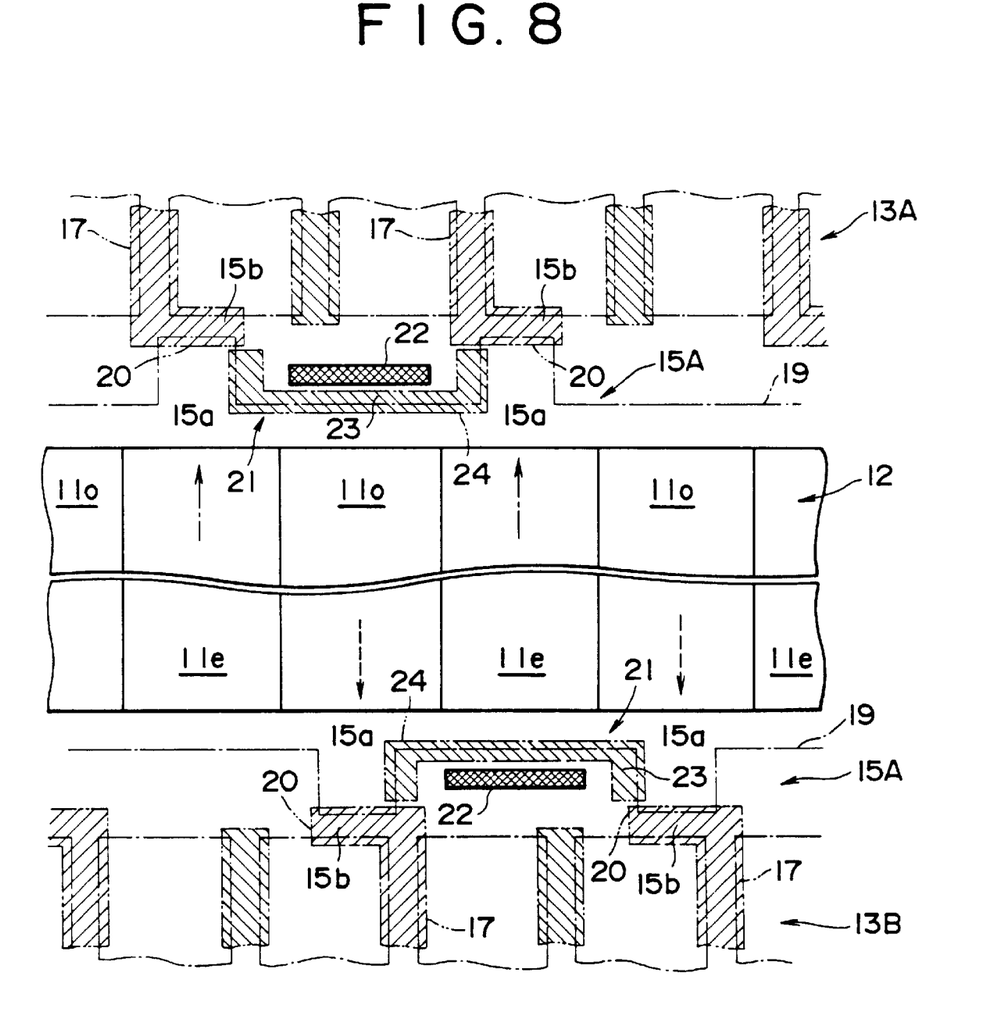
FIG. 8 is a plane diagram showing the structure of another embodiment provided by the present invention.
Figure 9:
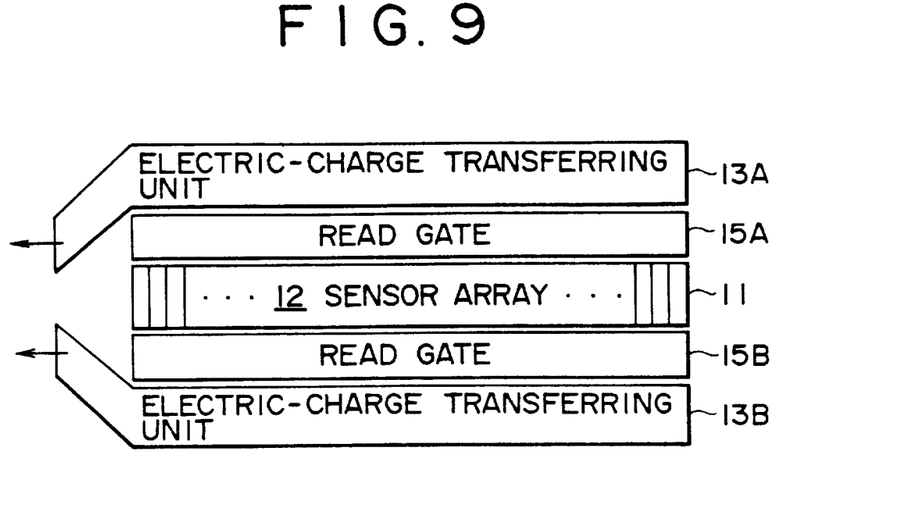
FIG. 9 is a diagram showing the configuration of a CCD linear sensor having a two-side read configuration.

A CCD linear sensor having a so-called two-side read configuration is shown in FIG. 8. The figure is a plane diagram showing the structure of essential components composing another embodiment provided by the present invention. Components of this figure identical with those shown in FIG. 1 are denoted by the same reference numerals and notations as the components of FIG. 1. In the case of this embodiment, electric-charge transferring units 13A and 13B are arranged on the upper and lower sides of the sensor array 12 respectively. A read gate 15A provided between the sensor array 12 and the electric-charge transferring unit 13A on the upper side of the sensor array 12 reads out electric charge of an even sensor unit 11e of the sensor array 12 and then transfers the electric charge to the electric-charge transferring unit 13A. On the other hand, a read gate 15B provided between the sensor array 12 and the electric-charge transferring unit 13B on the lower side of the sensor array 12 reads out electric charge of an odd sensor unit 11o of the sensor array 12 and then transfers the electric charge to the electric-charge transferring unit 13B.

The essential components of this embodiment are explained in concrete terms by referring to FIG. 8 as follows. The configuration on the side of the read gate 15A is entirely the same as the configuration on the side of the read gate 15B. In addition, both the configurations are basically the same as that of the configuration shown in FIG. 1. For these reasons, components on the sides of the read gates 15A and 15B are assigned the same reference numerals and notations as those of the configuration shown in FIG. 1 and only the portion on the side of the read gate 15A is explained. First of all, the read gate 15A comprises a first region 15a created at a location adjacent to the sensor array 12 and a second region 15b created at a location adjacent to the electric-charge transferring unit 13A. The first region 15a pertaining to a picture element is linked to the first region 15a of the adjacent picture element to form a shape resembling the U character on the diagram plane. The shape resembling U character is stretched over a pair of sensor units adjacent to each other (11e, 11e). It should be noted that, in the case of the side of the read gate 15B, the shape resembles the U character turned upside down instead of the U character.

At the read gate 15A, a read gate electrode 19 made of polysilicon of a first layer is provided above the first region 15a. In addition, a transfer gate electrode 20 made of polysilicon of a second layer is provided above the second region 15b. The transfer gate electrode 20 is created by extending a transfer gate electrode 17 on a transfer region TR of the electric-charge transferring unit 13A as is the case with the embodiment described previously.

On the inner side of every other read gate 15A described above, an electric-charge exhausting unit 21 is created in such a way that the electric-charge exhausting unit 21 is in contact with the first region 15a. In this way, only one electric-charge exhausting unit 21 is provided for each pair of sensor units adjacent to each other (11e, 11e). The electric-charge exhausting unit 21 has a configuration comprising an electric-charge exhaust drain 22 and an electric-charge exhausting gate 23. The electric-charge exhaust drain 22 having a shape resembling an island is provided on the inner side of the read gate 15A which has a shape like the U character. On the other hand, the electric-charge exhausting gate 23 is created to form a bent shape (a shape resembling the U character) enclosing the electric-charge exhaust drain 22 on the lower, right and left sides thereof as is seen in the figure. A shutter gate electrode 24 made of the polysilicon of the second layer is provided above the electric-charge exhausting gate 23.

Operations during the shutter, electric-charge storing and electric-charge reading periods in the configuration described above are carried out in exactly the same way as those of the previous embodiment. In addition, an OFCG function can also be implemented in exactly the same way as that of the embodiment described previously. As described above, in the CCD linear sensor having a two-side read configuration, only one electric-charge exhausting unit 21 is provided for each pair of sensor units adjacent to each other (11e, 11e) or (11o, 11o). When viewed from one side of the sensor array 12, only one electric-charge exhausting unit 21 is therefore provided for every four picture elements. As a result, the space can be reduced, providing a configuration which allows the size of the solid-state image sensing device to be made smaller with ease.

As described above, the present invention provides a configuration wherein an electric-charge exhausting units are provided on the same side of the sensor array as the electric-charge transferring units and, in addition, only one electric-charge exhausting unit is provided for each pair of sensor units (or photoelectric conversion elements) adjacent to each other. Since the configuration provided by the present invention can be adopted in a solid-state image sensing device having a sensor structure lengthened in the electric-charge reading direction wherein a staircase-like potential gradient is provided in the reading direction in a sensor unit, read and shutter residual images can be eliminated. On the top of that, the required space is small in comparison with the configuration wherein an electric-charge exhausting unit is provided for each sensor unit, resulting in a structure which allows the size of the solid-state image sensing device to be reduced with ease.

In addition, in the case of the solid-state image sensing device with a structure having first and second read gates between the sensor array and the electric-charge transferring unit, the first read gate is turned off while the electric-charge exhausting gate is turned on during an electric-charge storing period, allowing a noise component (electric charge generated in the first read gate during this electric-charge storing period) to be discarded away to the electric-charge exhaust drain. As a result, an image sensing signal which has only a small amount of noise produced by a dark current and other causes can be output.

What is claimed is:

1. A solid-state image sensing device comprising:
   a plurality of photoelectric conversion elements which generate electric charges;
   an electric-charge transferring unit which transfers said electric charges, said electric charge transferring unit having a transfer gate electrode which receives a transfer gate pulse;
   a plurality of read gates provided between said photoelectric conversion elements and said electric-charge transferring unit, first regions of adjacent read gates being linked to form a U-shape in plan view and which is stretched over a respective pair of adjacent said photoelectric conversion units;
   each of said read gates comprising a read gate electrode having a portion arranged adjacent to said photoelectric conversion elements and an extending portion extending from said electric-charge transferring unit to said portion arranged adjacent to said photoelectric conversion elements, wherein said electric charges can be transferred from said photoelectric conversion elements to said electric-charge transferring unit under the control of only two gate pulses;

an electric-charge exhausting unit for each read gate and its respective pair of photoelectric conversion units being provided between said respective pair of photoelectric conversion elements and said electric-charge transferring unit, said electric-charge exhausting unit being provided with the U-shape of its respective read gate, said electric-charge exhausting unit comprising an exhaust drain provided within said U-shape of said read gate; and a U-shaped shutter gate electrode surrounding three sides of said exhaust drain.

2. A solid-state image sensing device according to claim 1, wherein each said read gate comprises a first region created at a location adjacent to its respective photoelectric conversion elements and a second region created at a location adjacent to said electric-charge transferring unit.

3. A solid-state image sensing device according to claim 2, wherein said electric-charge transferring unit comprises a store region and a transfer region and said second region includes an extension of an electrode created on said transfer region wherein said store and transfer regions are arranged alternately in an electric-charge transferring direction.

4. A solid-state image sensing device comprising:

a plurality of photoelectric conversion elements which generate electric charges;

an electric-charge transferring unit which transfers said electric charges having a transfer gate electrode receiving a transfer gate pulse;

a plurality of read gates provided between said photoelectric conversion elements and said electric-charge transferring unit, first regions of adjacent read gates being linked to form a U-shape in plan view which is stretched over a respective pair of adjacent said photoelectric conversion units;

each of said read gates comprising a read gate electrode arranged adjacent to said photoelectric conversion elements and an extending portion extending from said transfer gate electrode arranged adjacent to said electric-charge transferring unit, wherein said electric charges can be transferred from said photoelectric conversion elements to said electric-charge transferring unit under effect of only two gate pulses;

an electric-charge exhausting unit for each read gate and its respective pair of photoelectric conversion units, said electric-charge exhausting unit being arranged adjacent to said read gate electrode and within said U-shape wherein said electric-charge exhausting unit receives a shutter gate pulse; and a U-shaped shutter gate electrode provided over said read gate and an exhaust drain provided within the U-shape of said linked adjacent first regions of said read gates and said shutter gate electrode.

* * * * *